(12) United States Patent
Kawashima

(10) Patent No.: US 11,063,055 B2
(45) Date of Patent: Jul. 13, 2021

(54) METHOD OF MANUFACTURING SEMICONDUCTOR DEVICE

(71) Applicant: RENESAS ELECTRONICS CORPORATION, Tokyo (JP)

(72) Inventor: Yoshiyuki Kawashima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 77 days.

(21) Appl. No.: 16/676,114

(22) Filed: Nov. 6, 2019

(65) Prior Publication Data
US 2021/0134818 A1 May 6, 2021

(51) Int. Cl.
*H01L 27/11534* (2017.01)
*H01L 27/11526* (2017.01)
*H01L 21/3213* (2006.01)
*H01L 21/311* (2006.01)

(52) U.S. Cl.
CPC .. *H01L 27/11534* (2013.01); *H01L 27/11526* (2013.01); *H01L 21/31116* (2013.01); *H01L 21/32135* (2013.01)

(58) Field of Classification Search
CPC ......... H01L 27/11534; H01L 27/11526; H01L 21/31116; H01L 21/32135
See application file for complete search history.

(56) References Cited

U.S. PATENT DOCUMENTS

| | | | | |
|---|---|---|---|---|
| 7,011,999 B2* | 3/2006 | Minami | | H01L 27/0629 257/E21.004 |
| 9,324,726 B2* | 4/2016 | Kawashima | | H01L 27/11524 |
| 2004/0229435 A1* | 11/2004 | Chen | | H01L 27/105 438/263 |
| 2011/0095348 A1* | 4/2011 | Chakihara | | H01L 29/4975 257/298 |
| 2016/0027651 A1* | 1/2016 | Kawashima | | H01L 29/42344 438/275 |
| 2016/0035734 A1* | 2/2016 | Kawashima | | H01L 27/11524 438/258 |
| 2016/0064226 A1* | 3/2016 | Kawashima | | H01L 27/11573 438/591 |
| 2016/0064402 A1* | 3/2016 | Umeda | | H01L 21/32135 438/241 |

(Continued)

FOREIGN PATENT DOCUMENTS

JP 2016-035973 A 3/2016

*Primary Examiner* — Earl N Taylor
(74) *Attorney, Agent, or Firm* — McDermott Will & Emery LLP

(57) ABSTRACT

A second gate dielectric film material and a memory gate electrode material are formed on a semiconductor substrate. The memory gate electrode material and the second gate dielectric film material formed in a peripheral circuit forming region are removed, and a part of each of the memory gate electrode material and the second gate dielectric film material is left in the memory cell forming region. Thereafter, in a state that the semiconductor substrate in the memory cell forming region is covered with a part of each of the memory gate electrode material and the second gate dielectric film material, heat treatment is performed to the semiconductor substrate to form a third gate dielectric film on the semiconductor substrate located in the peripheral circuit forming region. Thereafter, a memory gate electrode and a second gate dielectric film are formed.

11 Claims, 18 Drawing Sheets

(56) References Cited

U.S. PATENT DOCUMENTS

| | | | |
|---|---|---|---|
| 2016/0064507 A1* | 3/2016 | Amo | H01L 29/4975 257/314 |
| 2016/0204116 A1 | 7/2016 | Kawashima et al. | |
| 2016/0260795 A1* | 9/2016 | Abe | H01L 27/0629 |
| 2018/0097008 A1* | 4/2018 | Hayashi | H01L 21/823431 |

* cited by examiner

FIG. 18

| Applied voltage / Operation | Vd | Vcg | Vmg | Vs | Vb |
|---|---|---|---|---|---|
| Write | 0.3 V | 1 V | 6 V | 4 V | 0 V |
| Erase | 0 V | 0 V | -4 V | 4 V | 0 V |
| Read | 1 V | 1 V | 0 V | 0 V | 0 V |

METHOD OF MANUFACTURING SEMICONDUCTOR DEVICE

BACKGROUND

The present invention relates to a method of manufacturing a semiconductor device, for example, the present invention relates to a technique useful for application to method of manufacturing a semiconductor device having a split-gate type flash memory.

As a semiconductor device having a nonvolatile memory which can be electrically written and erased, a semiconductor device having a split-gate type flash memory is known. The flash memory includes a control gate electrode, a memory gate electrode, and a charge storage film formed under the memory gate electrode so as to be sandwiched by oxide films. The charge storage film is formed between the memory gate electrode and the semiconductor substrate, and between the memory gate electrode and the control gate electrode. The flash memory is mixed on a single semiconductor chip together with transistors used in peripheral circuits such as logic circuits and input/output circuits.

Japanese Unexamined Patent Application Publication No. 2016-35973 discloses a technique for forming gate dielectric films of transistors for peripheral circuits by performing heat treatment on a semiconductor substrate in a state that control gate electrodes and memory gate electrodes of memory cells of split-gate type flash memories are covered with protective films.

SUMMARY

However, in the manufacturing method of the above document 1, silicon oxide films may be formed between upper insulating films on charge storage films and memory gate electrodes by the above heat treatment. In other words, thicknesses of the upper insulating films between the memory gate electrodes and the charge storage films are increased by performing the heat treatment. Therefore, there is a possibility that the threshold voltages of the memory cells may vary. Further, there is a possibility that the write speeds and the erase speeds of the memory cells may be lowered.

Other objects and novel features will be apparent from the description and drawings of the specification.

Means of Solving the Problems

According to a method of manufacturing a semiconductor device according to an embodiment, gate dielectric films and gate electrodes of transistors for peripheral circuits are formed on a peripheral circuit forming region of a semiconductor substrate. Thereafter, a memory gate electrode material and a gate dielectric film material for memory cells formed on a memory cell forming region of the semiconductor substrate are etched to form memory gate electrodes and gate dielectric films of the memory cells.

According to the embodiment, the reliability of the semiconductor device can be improved.

BRIEF DESCRIPTION OF THE DRAWINGS

FIG. 18 is a table showing an example of voltages applied to respective portions of a selected memory cell in a write operation, an erase operation, and a read operation.

DETAILED DESCRIPTION

Figure 1:
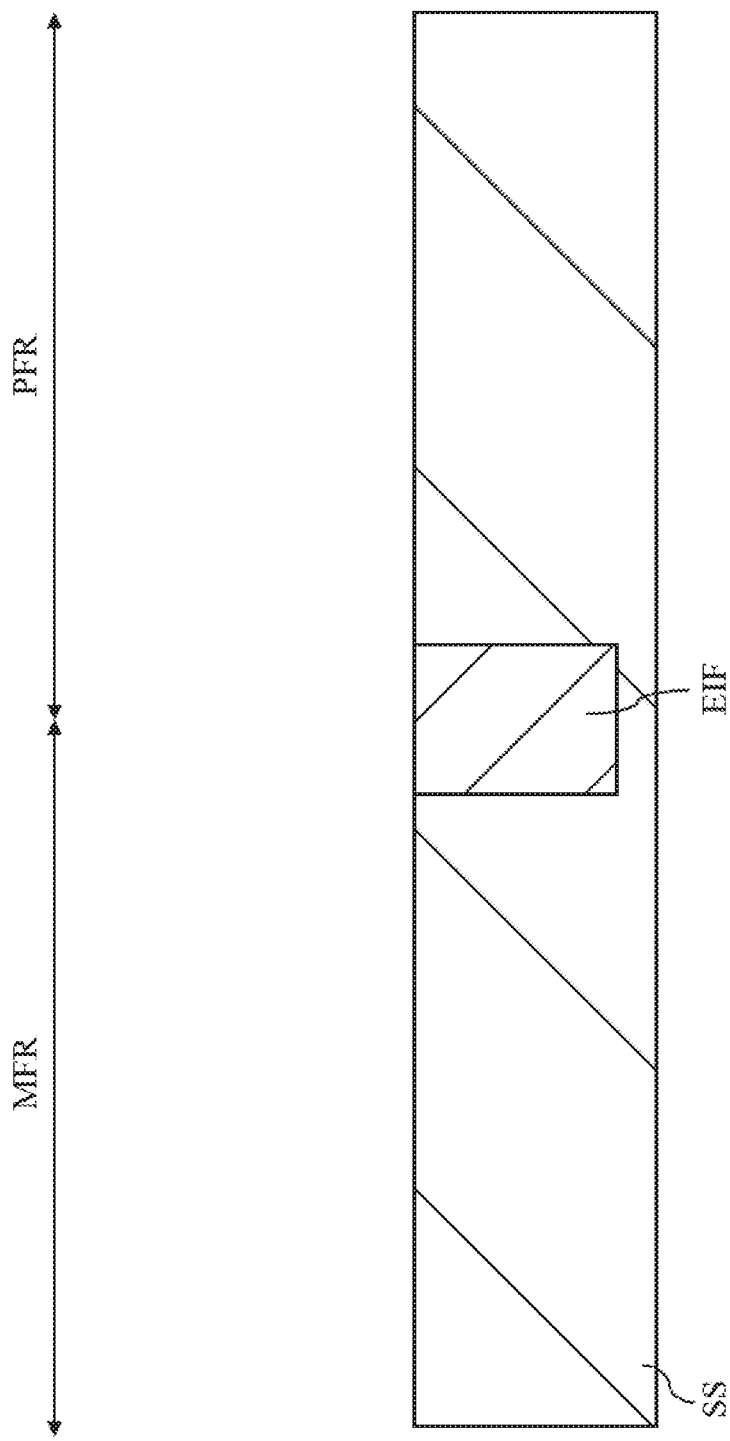
FIG. 1 is a cross-sectional view showing a step in a method of manufacturing a semiconductor device according to an embodiment.

Hereinafter, a semiconductor device according to an embodiment will be described in detail with reference to the drawings. In the specification and the drawings, the same reference numerals are assigned to components having the same functions, and a repetitive description thereof will be omitted. In addition, hatching may be omitted in order to make the drawing easier to see.

Method of Manufacturing Semiconductor Device

FIG. 1 to FIG. 15 are enlarged cross-sectional views in manufacturing steps in a method of manufacturing a semiconductor device according to the embodiment. The semiconductor device according to the embodiment has a memory cell forming region MFR and a peripheral circuit forming region PFR. FIG. 1 to FIG. 15 show the enlarged cross-sectional views of the semiconductor device in the memory cell forming region MFR and the peripheral circuit forming region PFR.

The memory cell forming region MFR is a region in which memory cells MC of the flash memories are formed. The peripheral circuit forming region PFR is a region in which transistors PT for peripheral circuits are formed. The transistors PT for peripheral circuits are MIS-type field effect transistors (MISFET) used for a Central Processing Unit (CPU), a sense amplifier, a column decoder, a row decoder, an input/output circuit, or the like.

First, as shown in FIG. 1, a semiconductor substrate SS is prepared. The semiconductor substrate SS is made of, for example, p-type monocrystalline silicon having a resistivity of about Mom to 10 Ωcm.

Next, element isolation films EIF are formed in the semiconductor substrate SS. The element isolation films EIF are formed, for example, using known Shallow Trench Isolation (STI) technique. The element isolation films EIF define active regions in which elements such as memory cells and transistors are formed.

Next, p-type wells are formed in the semiconductor substrate SS in the memory cell forming region MFR. The p-type wells are formed by ion-implanting p-type impurities such as boron (B) and aluminum (Al) into the semiconductor substrate SS. The p-type wells are formed at predetermined depths from a main surface of the semiconductor substrate SS toward a back surface of the semiconductor substrate SS facing away from the main surface. Note that illustration of the p-type wells is omitted.

Figure 2:
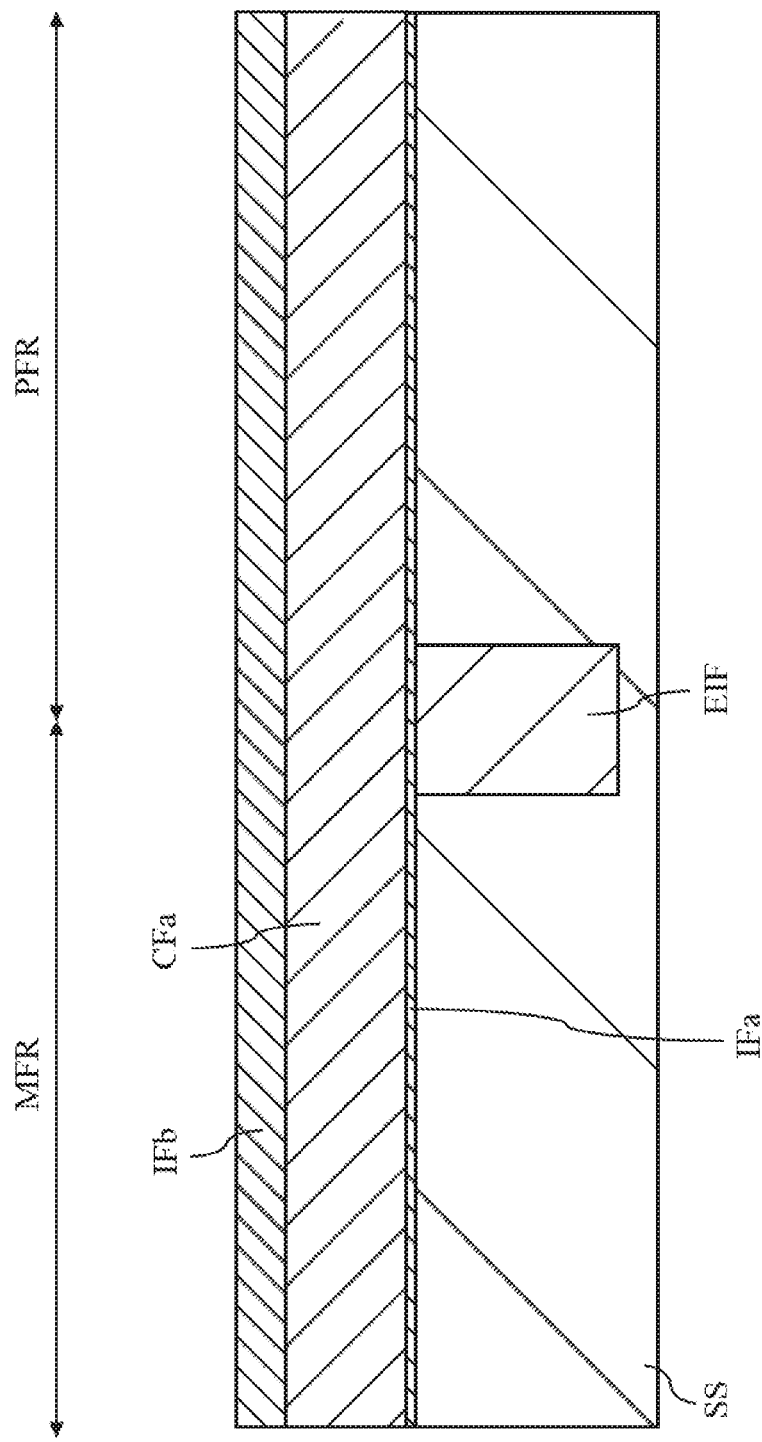
FIG. 2 is an enlarged cross-sectional view showing a step in the method of manufacturing the semiconductor device following the step shown in FIG. 1.

Next, as shown in FIG. 2, an insulating film IFa is formed on the semiconductor substrate SS. The insulating film IFa is formed by thermal oxidation method or Chemical Vapor Deposition (CVD) method. The insulating film IFa is a silicon oxide film, for example. The insulating film IFa may be a high dielectric constant insulating film having a dielectric constant higher than that of a silicon oxide film. When the insulating film IFa is the high dielectric constant insulating film, the insulating film IFa is formed by Atomic Layer Deposition (ALD) method. The insulating film IFa which is the high dielectric constant insulating film, is a film containing hafnium and oxygen, and is, for example, a hafnium oxide film or a hafnium silicate film. The insulating film IFa is an insulating film for gate dielectric films CGIF of control gate electrodes CG, which will be described later.

Next, a conductive film CFa is formed on the insulating film IFa. The conductive film CFa is formed by CVD method. The conductive film CFa is, for example, a polycrystalline silicon film. The conductive film CFa is a conductive film for the control gate electrodes CG described later. In order to reduce the resistance of the control gate electrodes CG, impurities such as phosphorus (P) and arsenic (As) may be introduced into the conductive film CFa.

Next, an insulating film IFb is formed on the conductive film CFa. The insulating film IFb is formed by CVD method. The insulating film IFb is a silicon oxide film, a silicon nitride film, or a stacked film thereof. The insulating film IFb is an insulating film for cap insulating films CIF described later.

Figure 3:
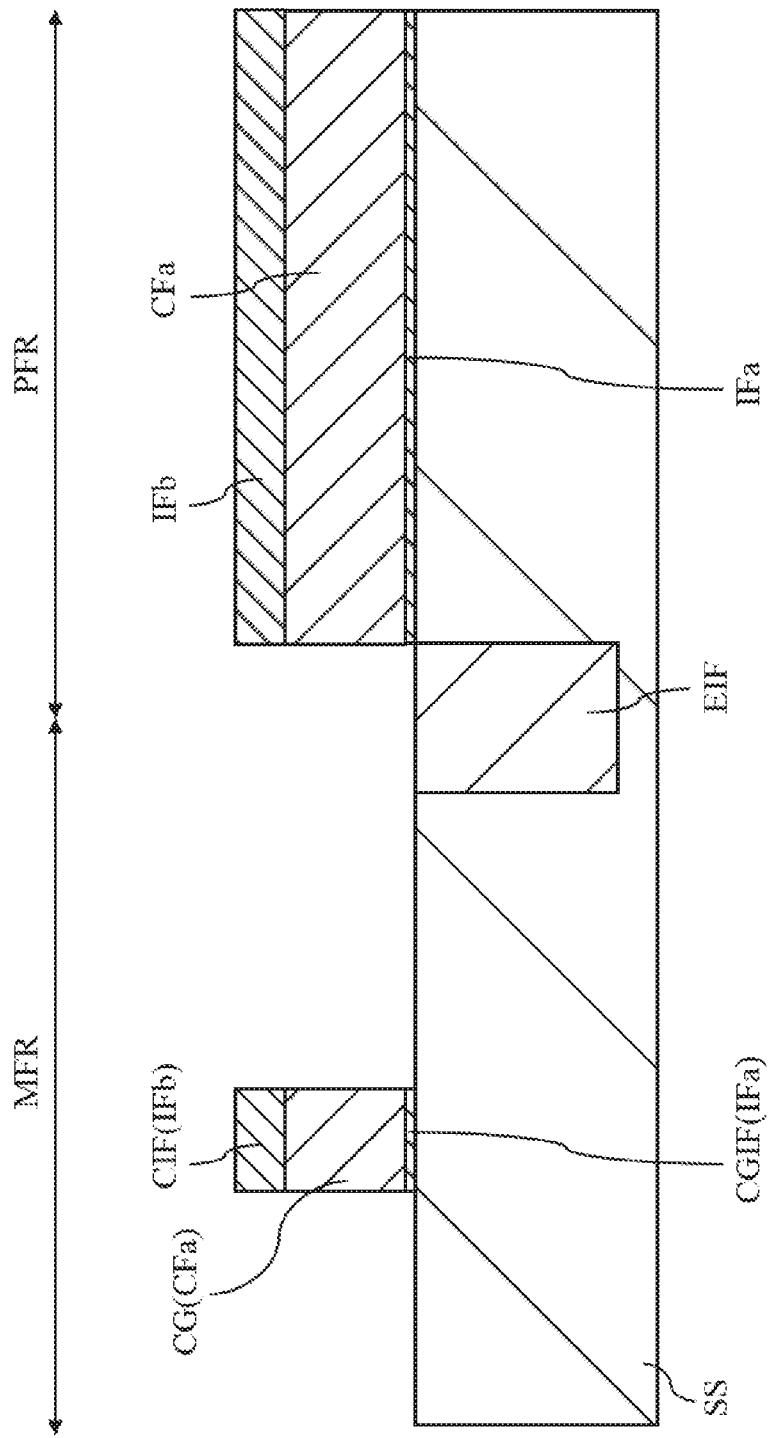
FIG. 3 is an enlarged cross-sectional view showing a step in the method of manufacturing the semiconductor device following the step shown in FIG. 2.

Next, as shown in FIG. 3, gate dielectric films CGIF, control gate electrodes CG, and cap insulating films CIF are formed on the semiconductor substrate SS located in the memory cell forming region MFR. The gate dielectric films CGIF, the control gate electrodes CG, and the cap insulating films CIF are formed by patterning the insulating film IFa, the conductive film CFa, and the insulating film IFb using known photolithography and etching techniques. The control gate electrodes CG are formed on the semiconductor substrate SS via the gate dielectric films CGIF. In the peripheral circuit forming region PFR, the insulating film IFa, the conductive film CFa, and the insulating film IFb are left without being patterned.

Figure 4:
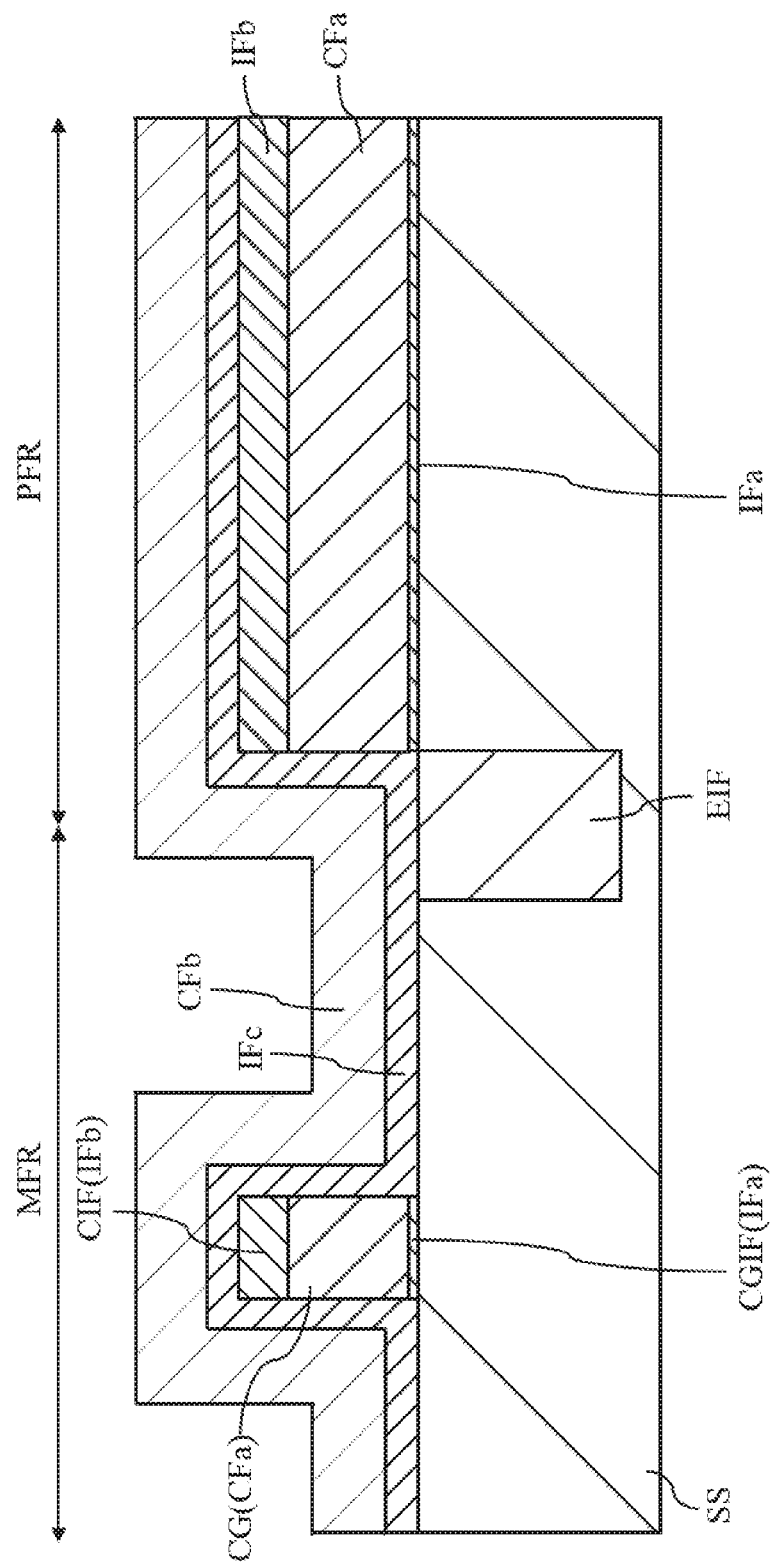
FIG. 4 is an enlarged cross-sectional view showing a step in the method of manufacturing the semiconductor device following the step shown in FIG. 3.

Next, as shown in FIG. 4, gate dielectric film material IFc is formed on the semiconductor substrate SS. The gate dielectric film material IFc is a stacked film formed of a lower insulating film, a charge storage film formed on the lower insulating film, and an upper insulating film formed on the charge storage film. The gate dielectric film material IFc is formed on the semiconductor substrate SS, the side surfaces of the control gate electrodes CG, and the side surfaces and the upper surface of the cap insulating films CIF in the memory cell forming regions MFR. In other words, the gate dielectric film material IFc is formed so as to cover the structures formed of the control gate electrodes CG and the cap insulating films CIF. The gate dielectric film material IFc is formed on the insulating film IFb in the peripheral circuit forming region PFR. The gate dielectric film material IFc is a stacked film, but in FIG. 4 and subsequent figures, the gate dielectric film material IFc is shown as a single layer film. The gate dielectric film material IFc is an insulating film for gate dielectric films MGIF of the memory gate electrodes MG, which will be described later.

Hereinafter, a method of forming the gate dielectric film material IFc will be described. First, a first insulating film is formed on the semiconductor substrate SS. The first insulating film is formed by In Situ Steam Generation (ISSG) oxidation, thermal oxidation, or CVD method. The first insulating film is a silicon oxide film.

Next, a charge storage film is formed on the first insulating film. The charge storage film is formed by, for example, CVD method. The charge storage film is a silicon nitride film. The charge storage film may be a high dielectric constant insulating film having a dielectric constant higher than that of the silicon nitride film. The high dielectric constant insulating film is formed by Atomic Layer Deposition (ALD) method. The high dielectric constant insulating film is a film containing hafnium and oxygen, for example, a hafnium oxide film or a hafnium silicate film.

Next, a second insulating film is formed on the charge storage film. The second insulating film is formed by, for example, CVD method. The second insulating film is a silicon oxide film. The second insulating film may be a film containing aluminum (Al), titanium (Ti), zirconium (Zr), yttrium (Y), lanthanum (La), praseodymium (Pr), or lutetium (Lu). In this case, the second insulating film is formed by, for example, ALD method. As described above, the gate dielectric film material IFc is formed on the semiconductor substrate SS.

Next, a memory gate electrode material CFb is formed on the semiconductor substrate SS. The memory gate electrode material CFb is formed on the gate dielectric film material IFc. The material and the formation method of the memory gate electrode material CFb are similar to those of the conductive film CFa. The memory gate electrode material CFb is a conductive film for memory gate electrodes MG described later. In order to reduce the resistance of the memory gate electrodes MG, impurities such as phosphorus (P) and arsenic (As) may be introduced into the memory gate electrode material CFb. As described above, the gate dielectric film material IFc and the memory gate electrode material CFb are formed on the semiconductor substrate SS located in the memory cell forming region MFR and the peripheral circuit forming region PFR so as to cover the control gate electrodes CG.

Figure 5:
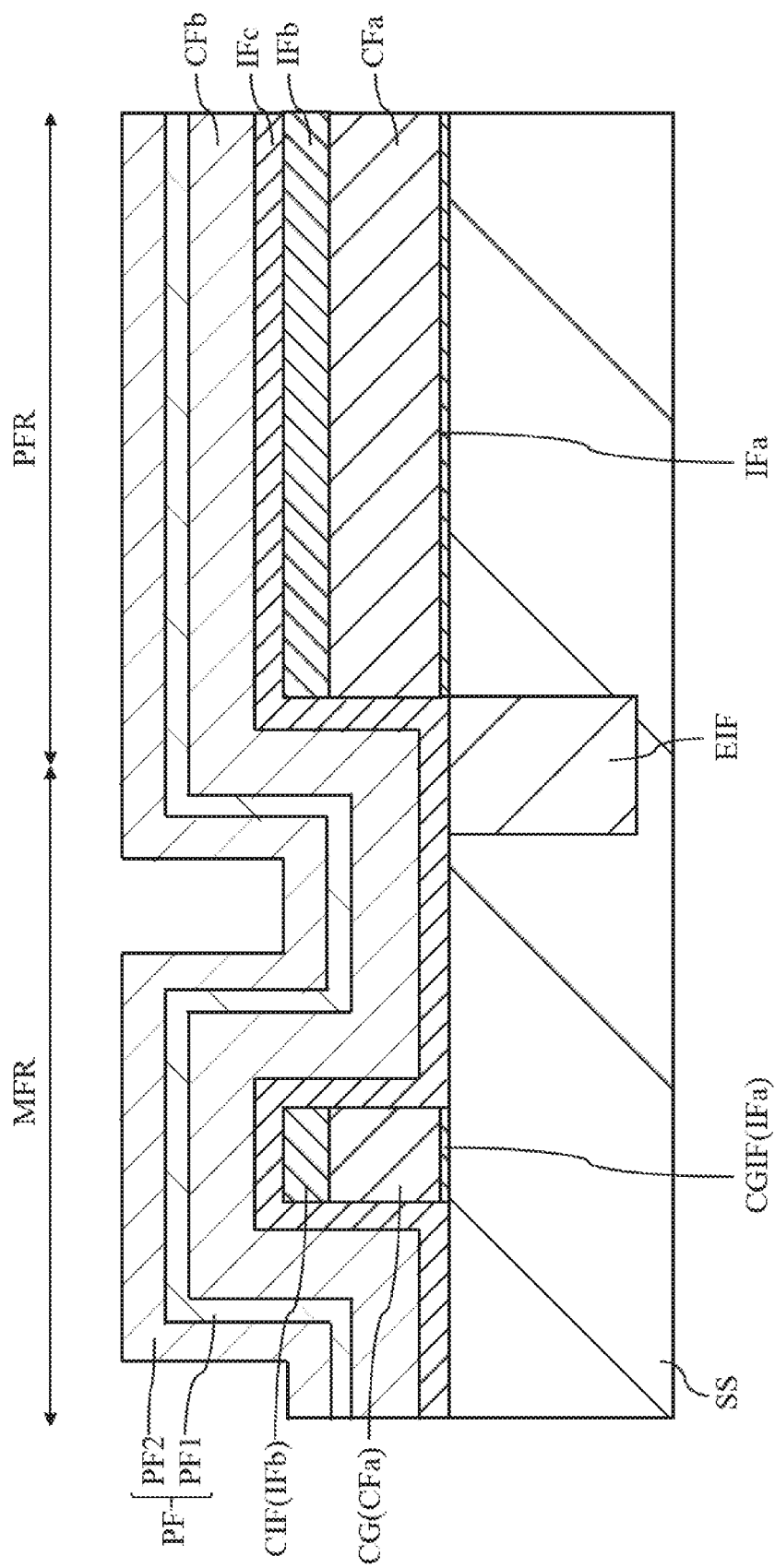
FIG. 5 is an enlarged cross-sectional view showing a step in the method of manufacturing the semiconductor device following the step shown in FIG. 4.

Next, as shown in FIG. 5, a protective film PF is formed on the semiconductor substrate SS. The protective film PF is formed on the memory gate electrode material CFb. The protective film PF is a stacked film formed of a first protective film PF1 and a second protective film PF2 formed on the first protective film PF1.

Hereinafter, a method of forming the protective film PF will be described. First, the first protective film PF1 is formed on the memory gate electrode material CFb. The first protective film PF1 is formed by CVD method. The first protective film PF1 is a silicone oxide film.

Next, the second protective film PF2 is formed on the first protective film PF1. The second protective film PF2 is formed by CVD method. The second protective film PF2 is a polycrystalline silicon film or a silicon nitride film. As described above, the protective film PF is formed on the semiconductor substrate SS.

Next, a resist film (not shown) is formed on the protective film PF located in the memory cell forming region MFR. The resist film covers the protective film PF located in the memory cell forming region MFR, and exposes the protective film PF located in the peripheral circuit forming region PFR.

Figure 6:
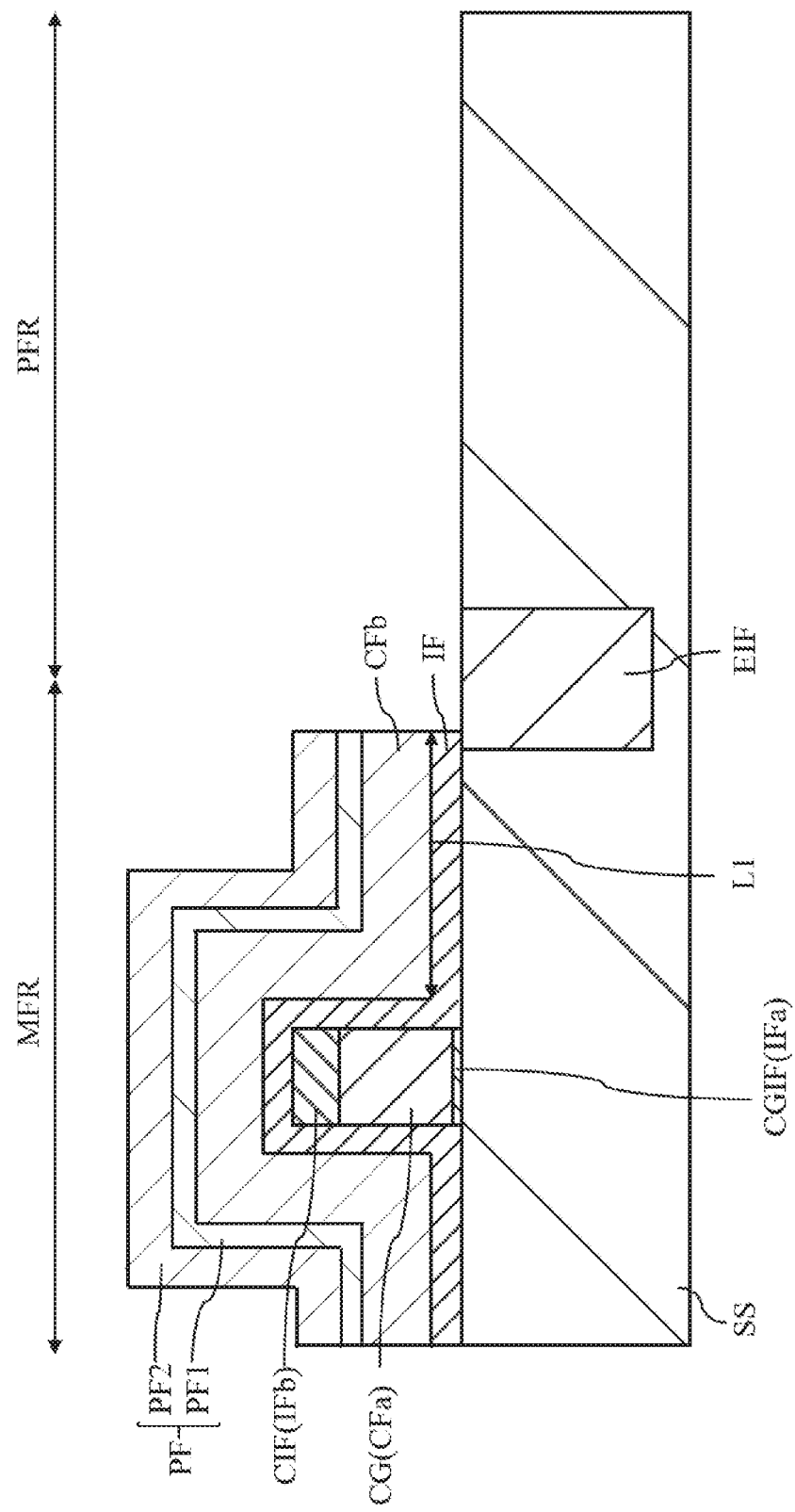
FIG. 6 is an enlarged cross-sectional view showing a step in the method of manufacturing the semiconductor device following the step shown in FIG. 5.

Next, as shown in FIG. 6, the protective film PF, the memory gate electrode material CFb, the gate dielectric film material IFc, the insulating film IFb, the conductive film CFa, and the insulating film IFa which are located in the peripheral circuit forming region PFR, are selectively removed using the resist film as a mask. First, the protective film PF is etched to form the protective film PF covering the memory gate electrode material CFb formed in the memory cell forming region MFR and exposing the memory gate electrode material CFb formed in the peripheral circuit forming region PFR. Next, by performing etching to the memory gate electrode material CFb using the protective film PF as a mask, the memory gate electrode material CFb and the gate dielectric film material IFc in the peripheral circuit forming region PFR are removed, and the memory gate electrode material CFb and the gate dielectric film material IFc in the memory cell forming region MFR are left. These films are removed by anisotropic etching (dry etching). As a result, the main surface of the semiconductor substrate SS located in the peripheral circuit forming region PFR is exposed. Thereafter, the resist film is removed.

At this time, in the memory cell forming region MFR, a part of each of the protective film PF, the memory gate electrode material CFb, and the gate dielectric film material IFc covered with the resist film RF are left without being removed. At this stage, memory gate electrodes MG and gate dielectric films MGIF are not formed. In a gate length direction of the control gate electrode CG, the length L1 of the bottom surface of the memory gate electrode material CFb adjacent to the control gate electrode CG via the gate dielectric film material IFc among the left memory gate electrode material CFb is larger than the length L2 of the bottom surface of the memory gate electrode MG described later.

Figure 7:
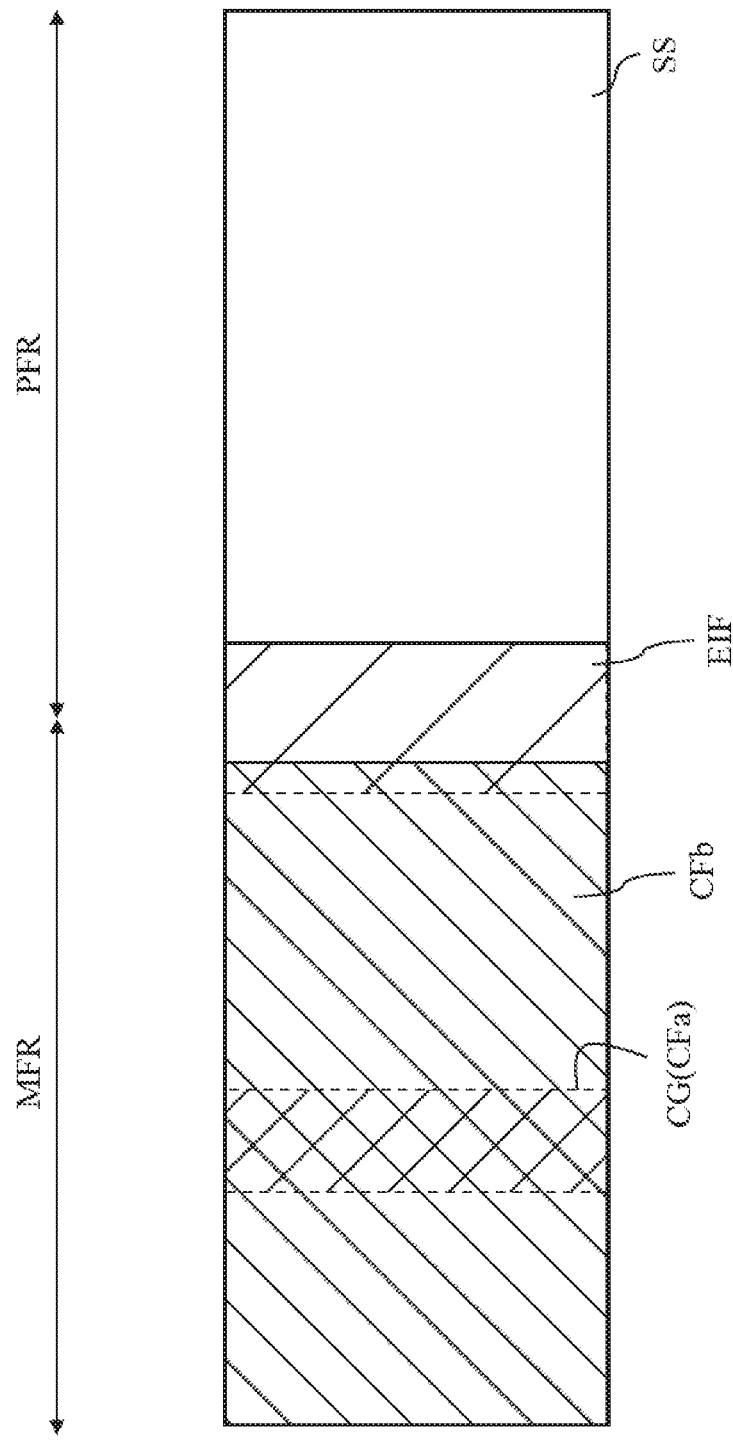
FIG. 7 is an enlarged plan view of the semiconductor device in the step shown in FIG. 6.

FIG. 7 is an enlarged plan view of the manufacturing step of the semiconductor device shown in FIG. 6. In FIG. 7, the semiconductor substrate SS, the element isolation film EIF, the control gate electrode CG, and the memory gate electrode material CFb are illustrated, and the illustration of other members is omitted. As shown in FIG. 7, the memory gate electrode material CFb is left on the semiconductor substrate SS located in the memory cell forming region MFR so as to cover the control gate electrode CG. That is, the main surface of the semiconductor substrate SS located in the memory cell forming region MFR is covered with the memory gate electrode material CFb. The semiconductor substrate SS located in the peripheral circuit forming region PFR is exposed from the memory gate electrode material CFb.

Next, well regions are formed in the semiconductor substrate SS located in the peripheral circuit forming region PFR. The well regions include p-type wells and n-type wells. The p-type wells are formed by ion-implanting p-type impurities such as boron (B) or aluminum (Al) into the semiconductor substrate SS. The n-type wells are formed by ion-implanting n-type impurities such as phosphorus (P) or arsenic (P) into the semiconductor substrate SS. Note that the illustration of the well regions of the peripheral circuit forming region PFR is omitted.

Figure 8:
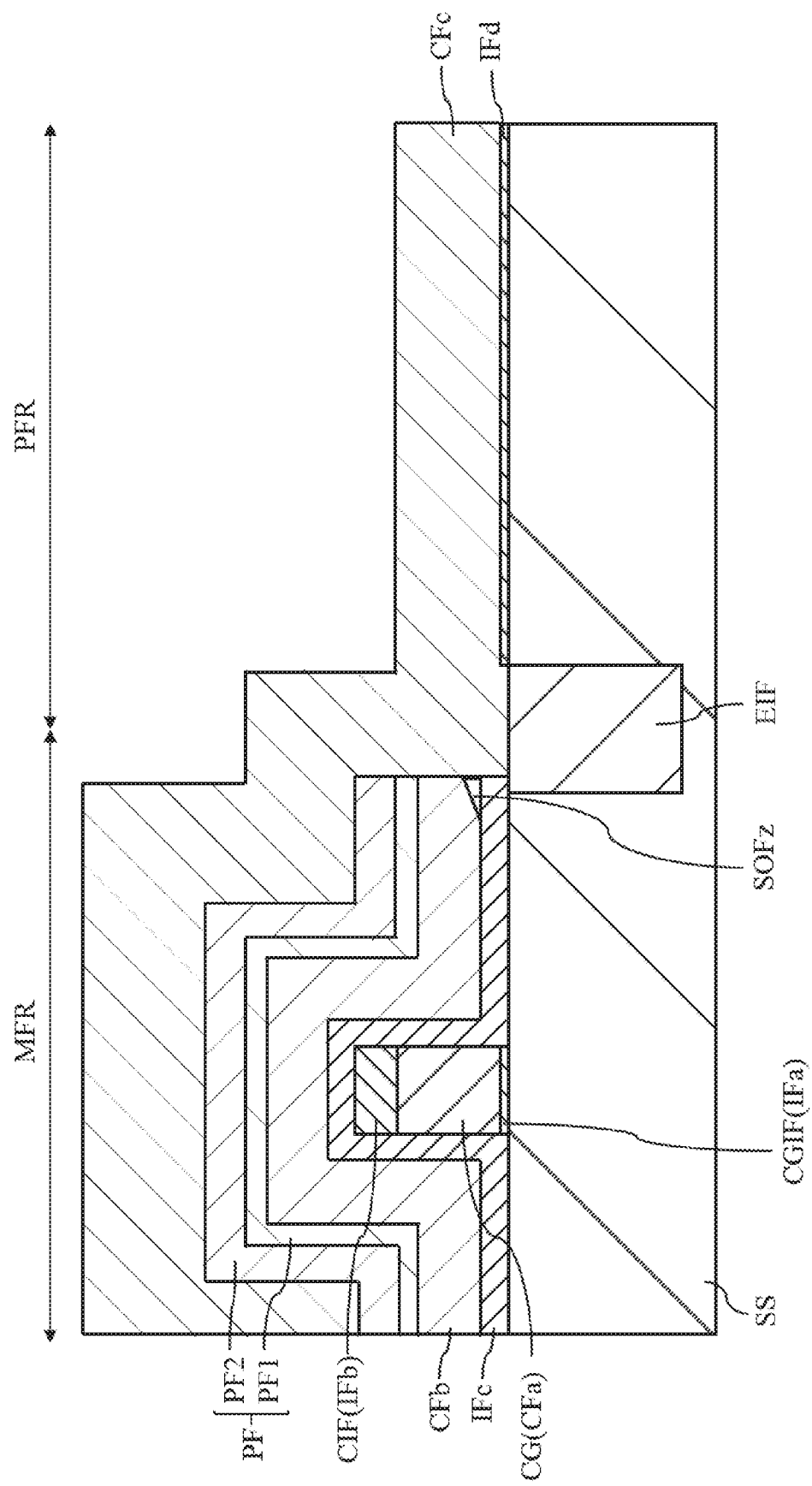
FIG. 8 is an enlarged cross-sectional view showing a step in the method of manufacturing the semiconductor device following the step shown in FIG. 6.

Next, as shown in FIG. 8, an insulating film IFd is formed on the semiconductor substrate SS located in the peripheral circuit forming region PFR. The insulating film IFd is formed in a state that the semiconductor substrate SS located in the memory cell forming region MFR is covered with a part of each of the memory gate electrode material CFb and the gate dielectric film material IFc. The insulating film IFd is formed by performing heat treatment to the semiconductor substrate SS in an oxygen-atmosphere. That is, the insulating film IFd is formed by thermal oxidation. The temperature of the heat treatment for forming the insulating film IFd is, for example, 700° C. or higher and 1100° C. or lower. The insulating film IFd is a silicon oxide film. The insulating film IFd is an insulating film for gate dielectric films GIF of the transistors PT formed in the peripheral circuit forming region PFR. The insulating film IFd may be a high dielectric constant insulating film having a dielectric constant higher than that of the silicon oxide film. In the case where the insulating film IFd is a high dielectric constant insulating film, the insulating film IFd is formed by ALD method. The high dielectric constant insulating film is a film containing hafnium and oxygen, for example, a hafnium oxide film or a hafnium silicate film.

At this stage, in the memory cell forming region MFR, an end portion of the memory gate electrode material CFb and an end portion of the gate dielectric film material IFc are exposed from the protective film PF. Therefore, a silicon oxide film SOFz can be formed between the end portion of the memory gate electrode material CFb and the end portion of the gate dielectric film material IFc by heat treatment in an oxygen-atmosphere for forming the insulating film IFd, as shown in FIG. 8. The silicon oxide film SOFz includes part of the memory gate electrode material CFb. Similarly, silicon oxide films may be formed on the second protective film PF2 formed of a polycrystalline silicon film and on the side surfaces of the memory gate electrode material CFb exposed from the second protective film PF2, but the silicon oxide films are not shown.

Next, a conductive film CFc is formed on the semiconductor substrate SS. In the peripheral circuit forming region PFR, the conductive film CFc is formed on the insulating film IFd. In the memory cell forming region MFR, the conductive film CFc is formed so as to cover the main surface of the semiconductor substrate SS. A material and formation method of the conductive film CFc are the same as those of the conductive film CFa and the memory gate electrode material CFb.

Figure 9:
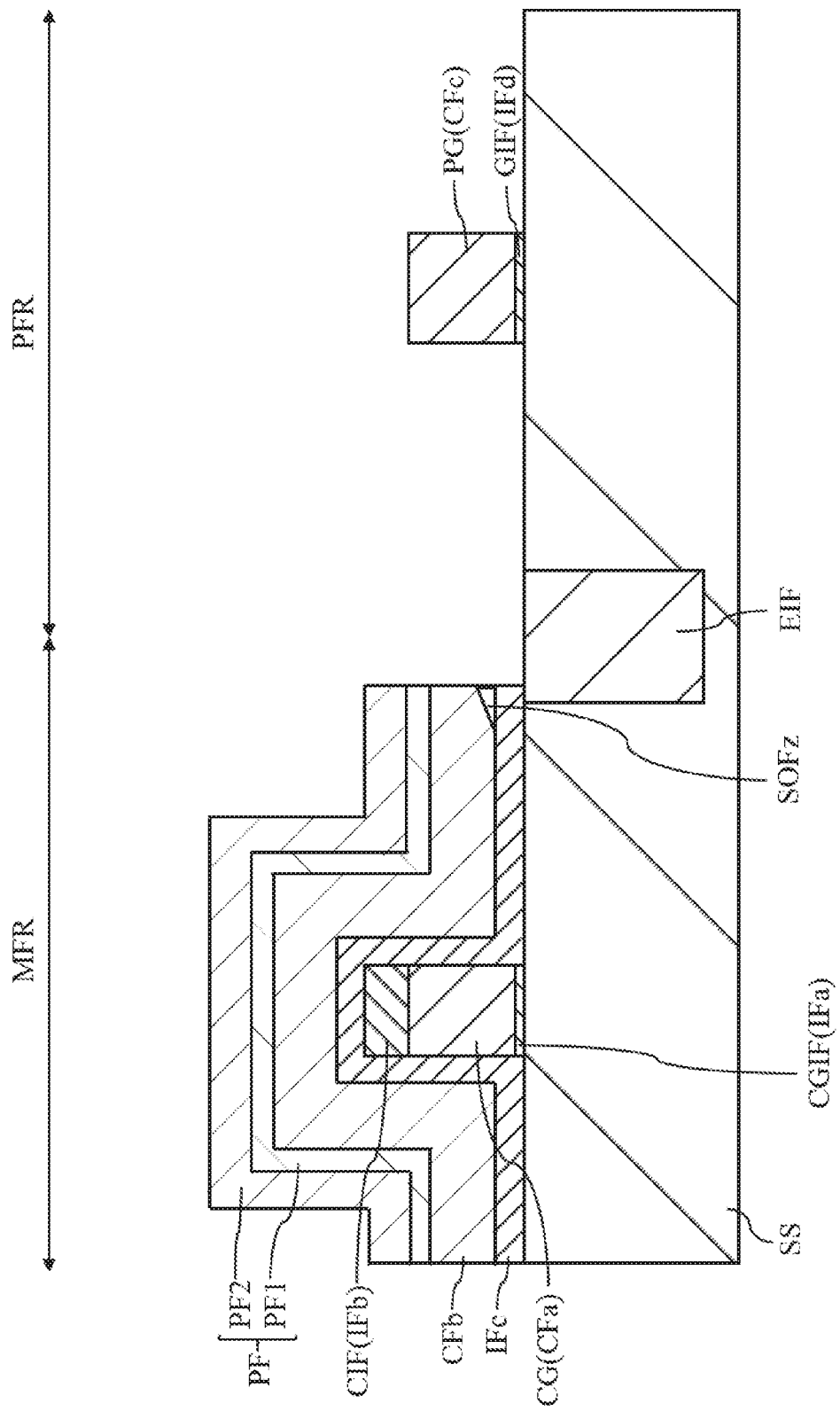
FIG. 9 is an enlarged cross-sectional view showing a step in the method of manufacturing the semiconductor device following the step shown in FIG. 8.

Next, as shown in FIG. 9, gate dielectric films GIF and gate electrodes PG are formed on the semiconductor substrate SS located in the peripheral circuit forming region PFR. The gate electrodes PG are formed on the gate dielectric films GIF. The gate dielectric films GIF and the gate electrodes PG are formed by patterning the insulating film IFd and the conductive film CFc using known photolithography and etching techniques. In the memory cell forming region MFR, the conductive film CFc is removed.

Figure 10:
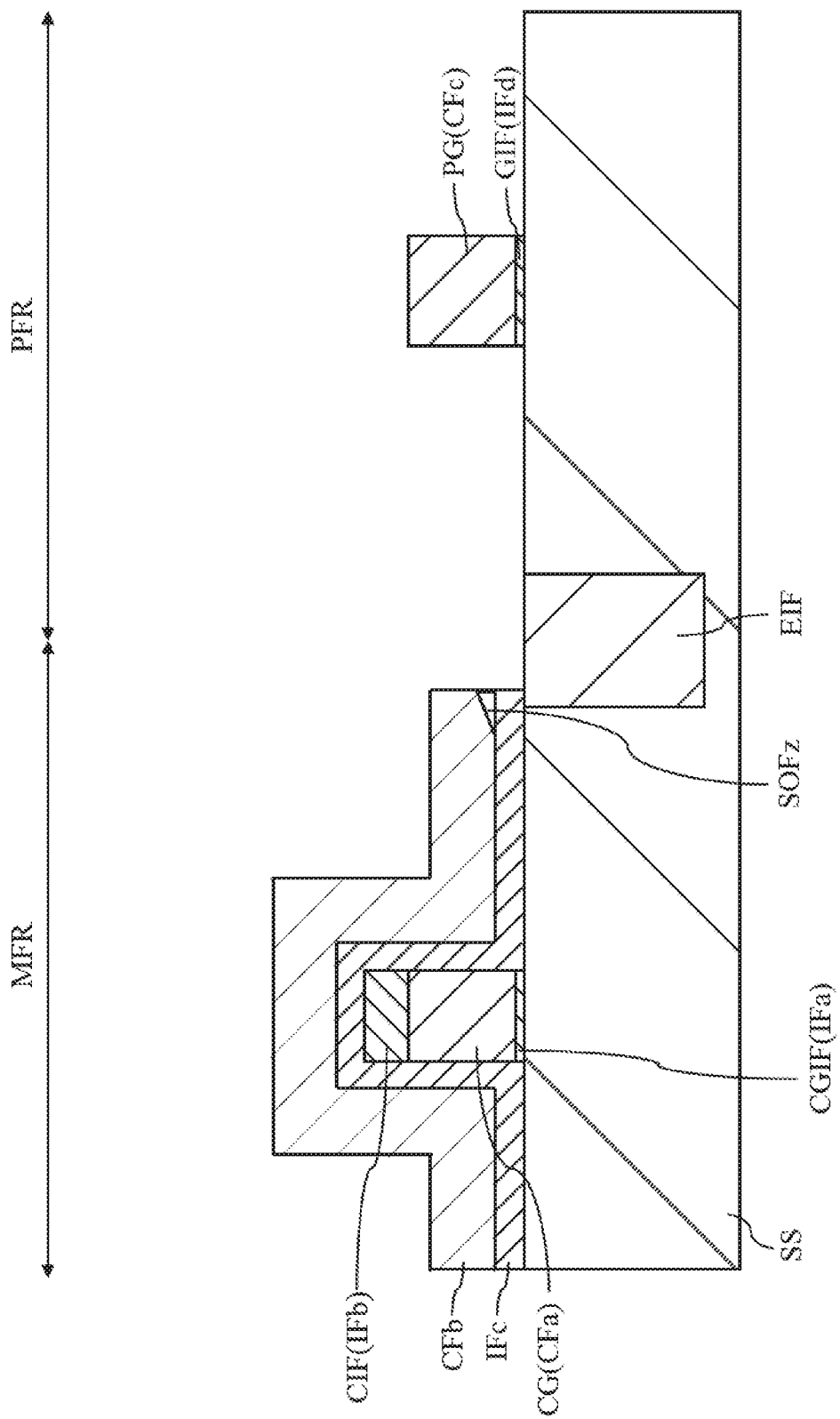
FIG. 10 is an enlarged cross-sectional view showing a step in the method of manufacturing the semiconductor device following the step shown in FIG. 9.

Next, as shown in FIG. 10, the protective film PF is removed. First, the second protective film PF2 is removed by etching the second protective film PF2 in a state that a resist film (not shown) exposing the main surface of the semiconductor substrate SS in the memory cell forming region MFR and covering the main surface of the semiconductor substrate SS in the peripheral circuit forming region PFR is formed. Subsequently, the first protective film PF1 is removed by etching the first protective film PF1 with the resist film formed thereon.

Figure 11:
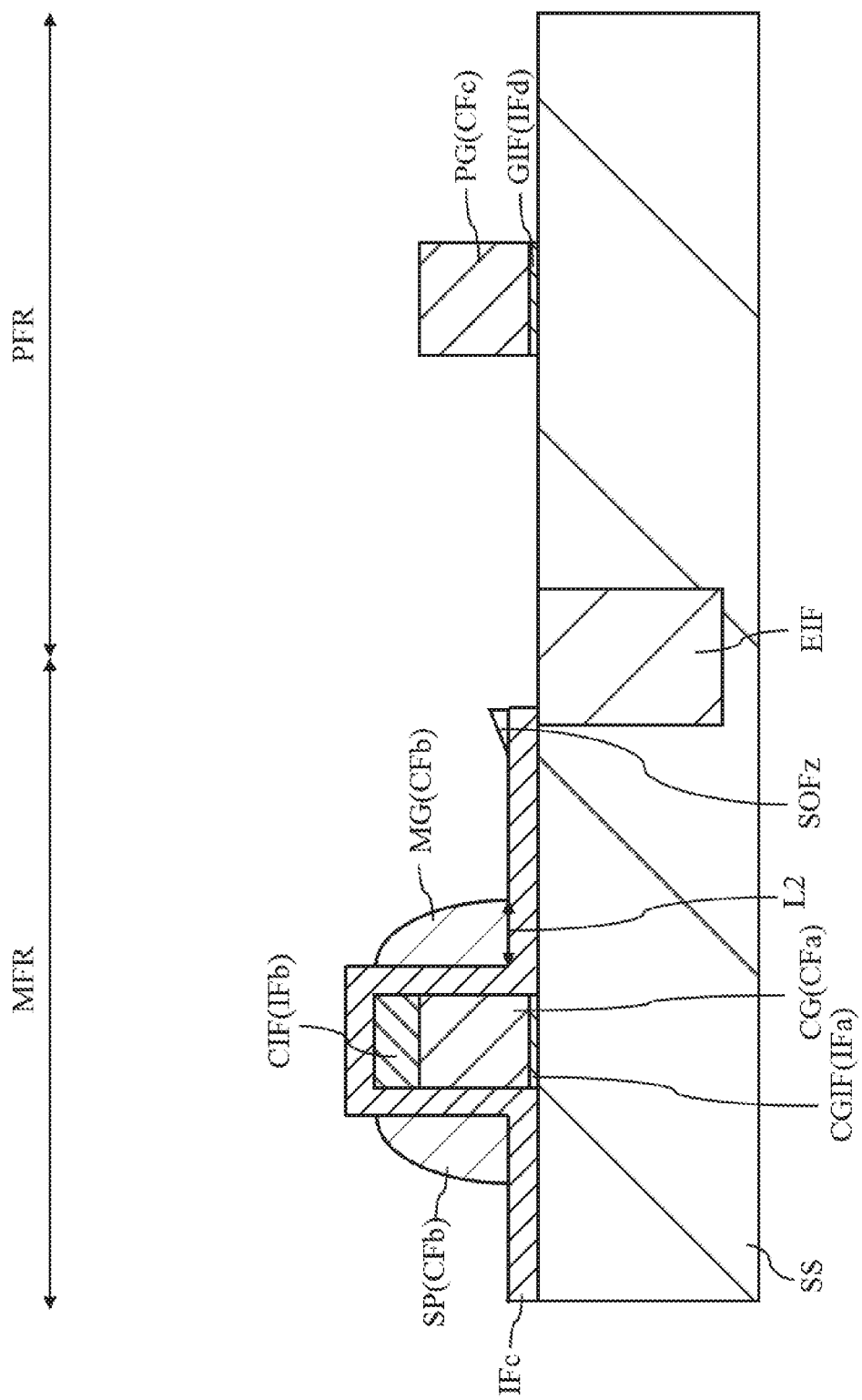
FIG. 11 is an enlarged cross-sectional view showing a step in the method of manufacturing the semiconductor device following the step shown in FIG. 10.

Subsequently, as shown in FIG. 11, memory gate electrodes MG and spacers SP are formed on the semiconductor substrate SS. By performing anisotropic etching (dry etching) to the memory gate electrode material CFb in a state that the resist film is formed on the semiconductor substrate SS, the memory gate electrode material CFb is left on both side surfaces of the control gate electrodes CG via the gate dielectric film material IFc. The memory gate electrode material CFb left on one side surface of the control gate electrode CG is a memory gate electrode MG. That is, the memory gate electrode MG is made of the memory gate electrode material CFb. The memory gate electrode material CFb left on the other side surface of the control gate electrode CG is a spacer SP. Thereafter, the resist film is removed.

In the gate length direction of the control gate electrode CG, the length L2 of the bottom surface of the left memory gate electrode material CFb is shorter than the length L1 of the bottom surface of the left memory gate electrode material CFb in the step of FIG. 6. The memory gate electrodes MG are formed by processing the memory gate electrode material CFb twice.

Figure 12:
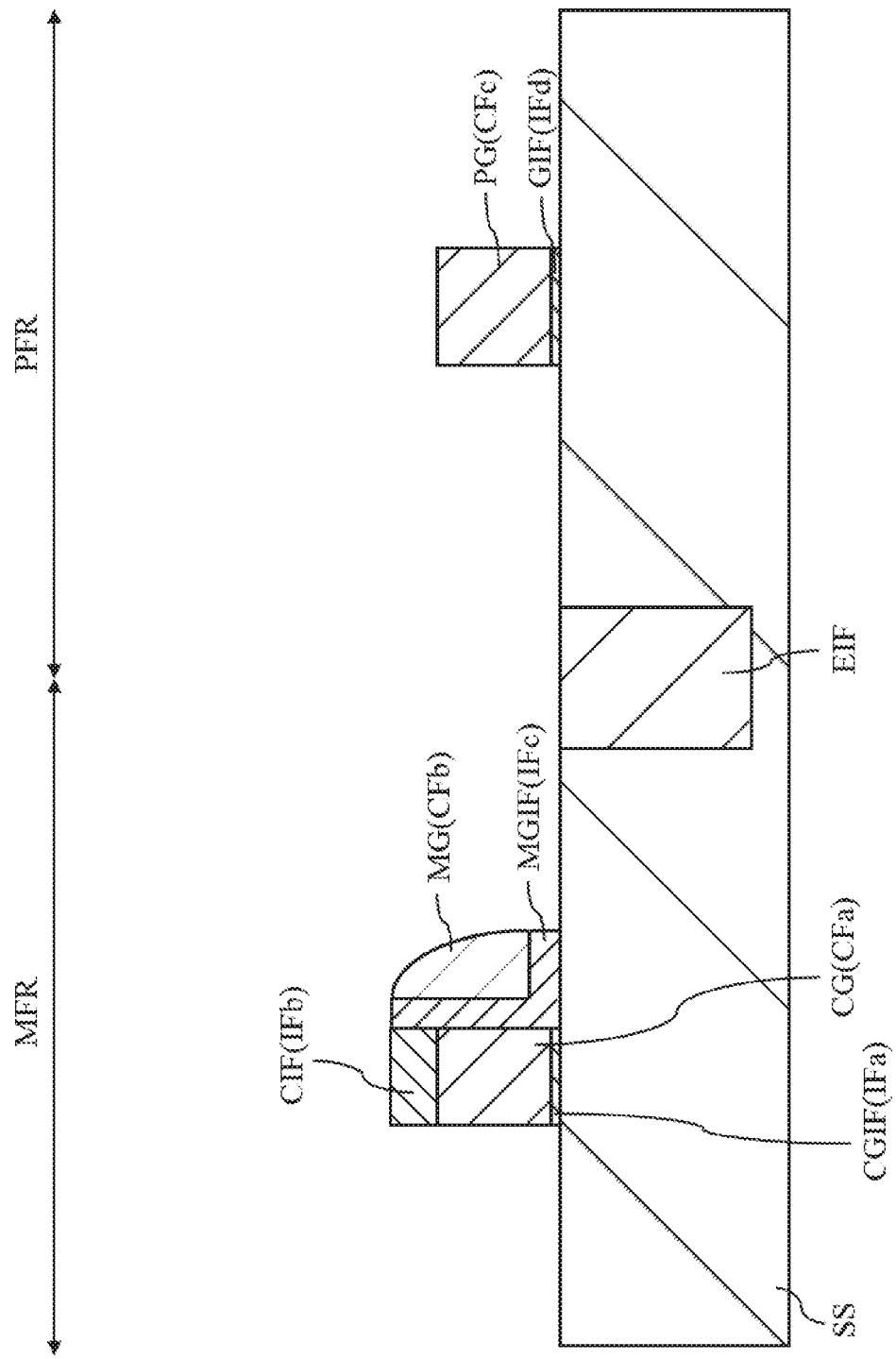
FIG. 12 is an enlarged cross-sectional view showing a step in the method of manufacturing the semiconductor device following the step shown in FIG. 11.

Next, as shown in FIG. 12, the spacer SP is removed. The spacer SP is removed by etching the spacer SP in a state that a resist film (not shown) exposing the spacer SP and covering the memory gate electrode MG and the main surface of the semiconductor substrate SS located in the peripheral circuit forming region PFR is formed. Since the memory gate electrode MG is covered with the resist film, it is left without being removed. Thereafter, the resist film is removed.

Next, gate dielectric films MGIF are formed on the semiconductor substrate SS. By etching the gate dielectric film material IFc exposed from the memory gate electrodes MG, the gate dielectric film material IFc exposed from the memory gate electrode MG is removed. At this stage, the gate dielectric film material IFc covered with the memory gate electrodes MG are left. As a result, the gate dielectric films MGIF are formed between the memory gate electrodes MG and the control gate electrodes CG and between the memory gate electrodes MG and the semiconductor substrate SS. The gate dielectric films MGIF are formed of the gate dielectric film material IFc. The memory gate electrodes MG and the gate dielectric films MGIF are formed by sequentially etching parts of the memory gate electrode material CFb and the gate dielectric film material IFc left on the semiconductor substrate SS located in the memory cell forming region MFR, respectively.

At this stage, the silicon oxide film SOFz formed at the end portion of the memory gate electrode material CFb is removed by etching. Therefore, the silicon oxide film SOFz is not left between the memory gate electrodes MG and the gate dielectric film material IFc.

Figure 13:
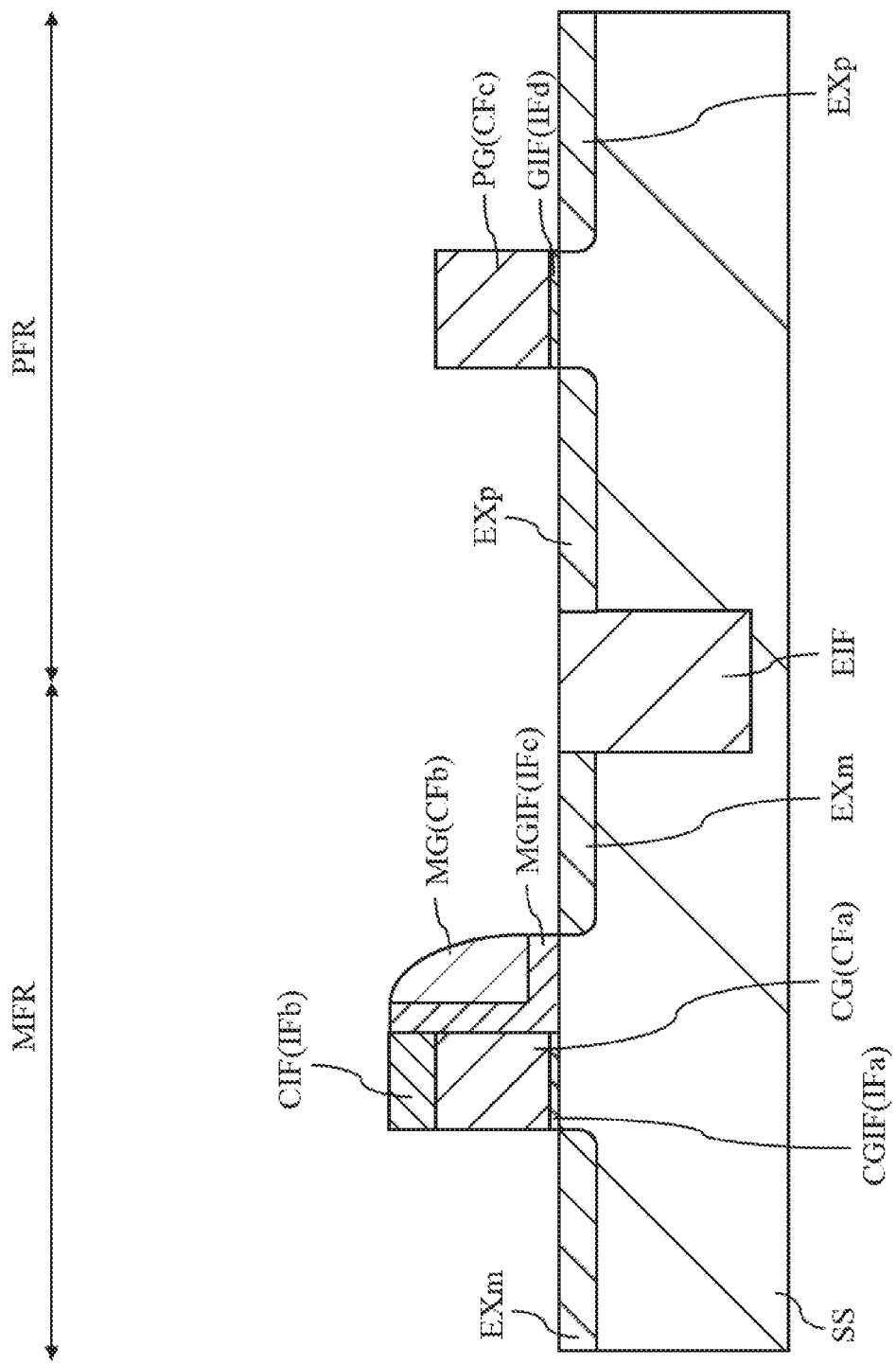
FIG. 13 is an enlarged cross-sectional view showing a step in the method of manufacturing the semiconductor device following the step shown in FIG. 12.

Next, as shown in FIG. 13, semiconductor regions EXm (extension regions) are formed in the semiconductor substrate SS located in the memory cell forming region MFR, and semiconductor regions EXp (extension regions) are formed in the semiconductor substrate SS located in the peripheral circuit forming region PFR.

The semiconductor regions EXm are formed by ion-implanting n-type impurities such as phosphorus (P) or arsenic (As) into the semiconductor substrate SS using the patterns formed of the control gate electrodes, the memory gate electrodes MG and the gate dielectric films MGIF as masks. The semiconductor regions EXm are formed in portions of the semiconductor substrate SS adjacent to the patterns in plan view.

The semiconductor regions EXp are formed by ion-implanting impurities into the semiconductor substrate SS using the gate electrodes PG as masks. In a case where the semiconductor regions EXp are n-type semiconductor regions, the impurities are n-type impurities such as phosphorus (P) or arsenic (As). In a case where the semiconductor regions EXp are p-type semiconductor regions, the impurities are p-type impurities such as boron (B) or aluminum (Al). The semiconductor regions EXp are formed in portions of the semiconductor substrate SS adjacent to the gate electrodes PG in plan view. Note that Halo regions may be formed in the semiconductor substrate SS. The Halo regions are formed by ion-implanting impurities into the semiconductor substrate SS using the gate electrodes PG as masks. In a case where the semiconductor regions EXp are n-type semiconductor regions, the impurities configuring the Halo regions are, for example, p-type impurities such as boron (B) or aluminum (Al). In a case where the semiconductor regions EXp are p-type semiconductor regions, the impurities configuring the Halo region are n-type impurities such as phosphorus (P) or arsenic (As).

Figure 14:
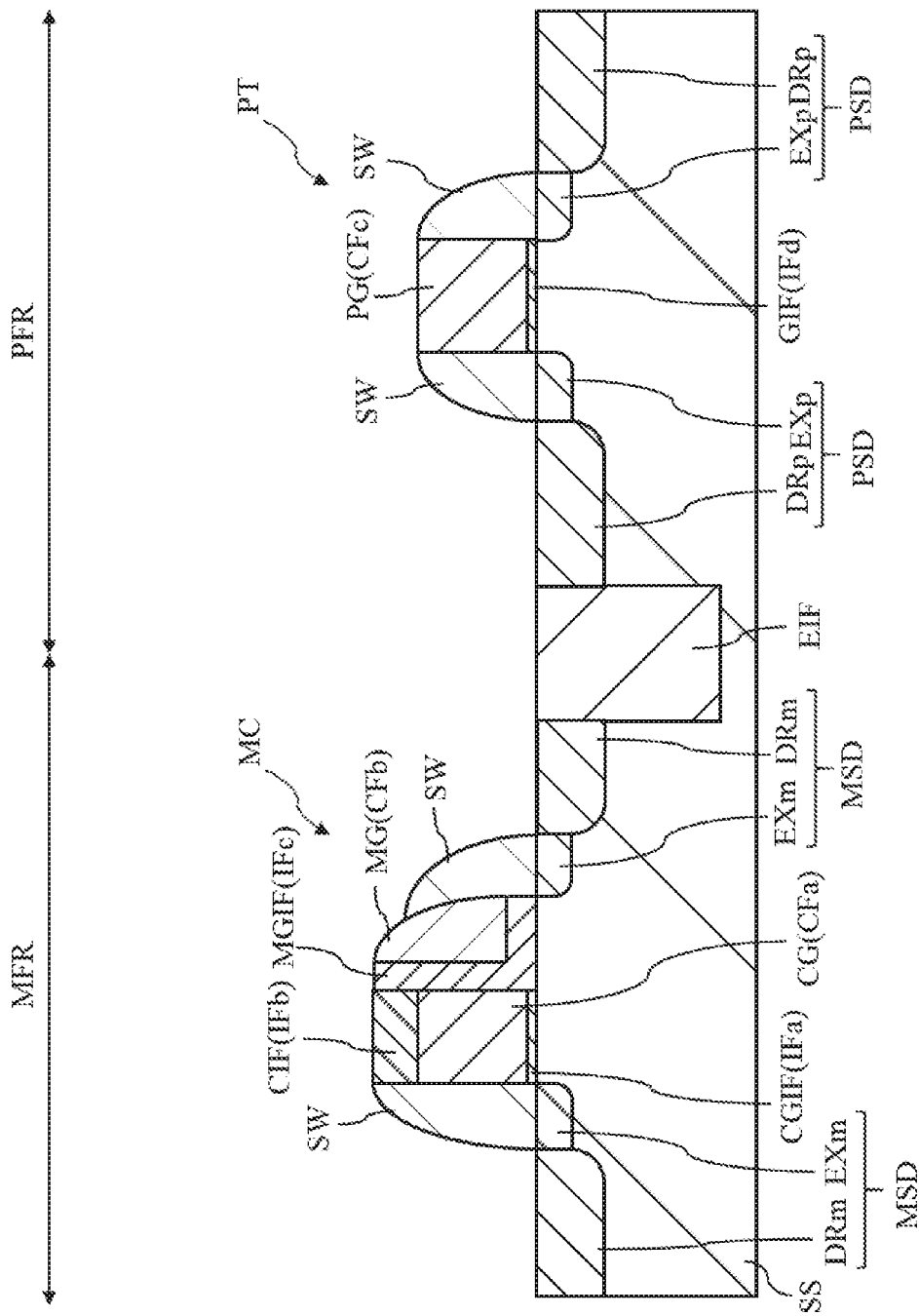
FIG. 14 is an enlarged cross-sectional view showing a step in the method of manufacturing the semiconductor device following the step shown in FIG. 13.

Next, as shown in FIG. 14, sidewall spacers SW are formed on the side surfaces of the control gate electrodes CG, the side surfaces of the memory gate electrodes MG, and the side surfaces of the gate electrodes PG. The sidewall spacers SW are formed using known insulating film forming method and etching technique.

Next, a semiconductor regions DRm (diffusion regions) are formed in the semiconductor substrate SS located in the memory cell forming region MFR, and semiconductor regions DRp (diffusion regions) are formed in the semiconductor substrate SS located in the peripheral circuit forming region PFR.

The semiconductor regions DRm are formed by ion-implanting n-type impurities such as phosphorus (P) or arsenic (As) into the semiconductor substrate SS using the patterns formed of the control gate electrodes, the memory gate electrodes MG, the gate dielectric films MGIF, and the sidewall spacers SW as masks. The semiconductor regions DRm are formed in portions of the semiconductor substrate SS adjacent to the patterns in plan view. The semiconductor regions MSD formed of the semiconductor regions EXm and DRm are semiconductor regions corresponding to the source regions and/or the drain regions of the memory cells MC.

The semiconductor regions DRp are formed by ion-implanting impurities into the semiconductor substrate SS using the gate electrodes PG and the sidewall spacers SW as masks. In a case where the semiconductor regions DRp are n-type semiconductor regions, the impurities are n-type impurities such as phosphorus (P) or arsenic (As). In a case where the semiconductor regions EXp are p-type semiconductor regions, the impurities are p-type impurities such as boron (B) or aluminum (Al). The semiconductor regions EXp are formed in portions of the semiconductor substrate SS adjacent to the sidewall spacers SW in plan view. One of the semiconductor regions PSD including the semiconductor regions EXp and DRp is a source region of the transistor PT, and the other is a drain region.

Next, silicide layers are formed on the semiconductor regions DRm and DRp, the memory gate electrodes MG, and the gate electrodes PG, respectively. The silicide layers are formed by known silicide forming technique. In FIG. 14, illustration of the silicide layers is omitted.

As a result, as shown in FIG. 14, in the memory cell forming region MFR, memory cells MC having the control gate electrodes CG, the memory gate electrodes MG, the gate dielectric films CGIF and MGIF, the cap insulating films CIF, the sidewall spacers SW, and the semiconductor regions MSD are formed. In the peripheral circuit forming region PFR, transistors PT having the gate electrodes PG, the gate dielectric films GIF, the sidewall spacers SW, and the semiconductor regions PSD are formed.

In present embodiment, the gate electrodes PG made of polycrystalline silicon are formed as the gate electrodes of the transistors PT, but the gate electrodes PG made of metal may be formed. After the interlayer insulating film is formed so as to cover the transistors PT, the interlayer insulating film is polished to expose the upper surfaces of the gate electrodes PG made of polycrystalline silicon. The gate electrodes PG are etched to remove the gate electrodes PG made of polycrystalline silicon, thereby forming trenches on the gate dielectric films GIF. Thereafter, gate electrodes PG made of metal are formed in the trenches. The metal configuring the gate electrodes PG is, for example, aluminum (Al), tungsten (W), or the like.

Figure 15:
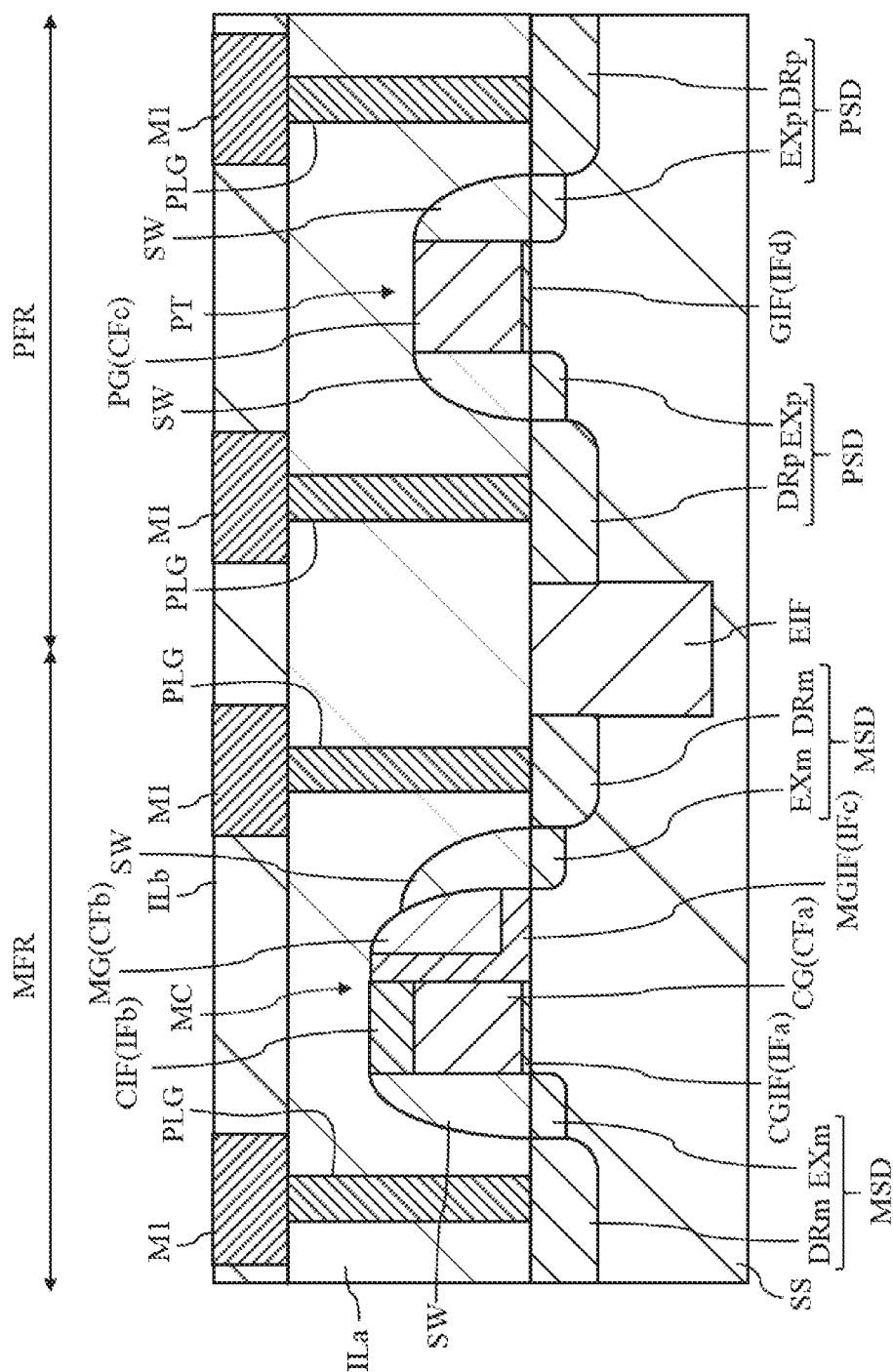
FIG. 15 is an enlarged cross-sectional view showing a step in the method of manufacturing the semiconductor device following the step shown in FIG. 14.

Next, as shown in FIG. 15, interlayer insulating films ILa, ILb, plugs PLG, and wirings M1 are formed over the semiconductor substrate SS. These are formed using known insulating film forming method, metal film forming method, and etching technique. Then, a multilayer wiring is formed over the wirings M1.

As described above, the semiconductor device according to the present embodiment is manufactured.

Main Features and Effects of Method of Manufacturing Semiconductor Device

Figure 16:
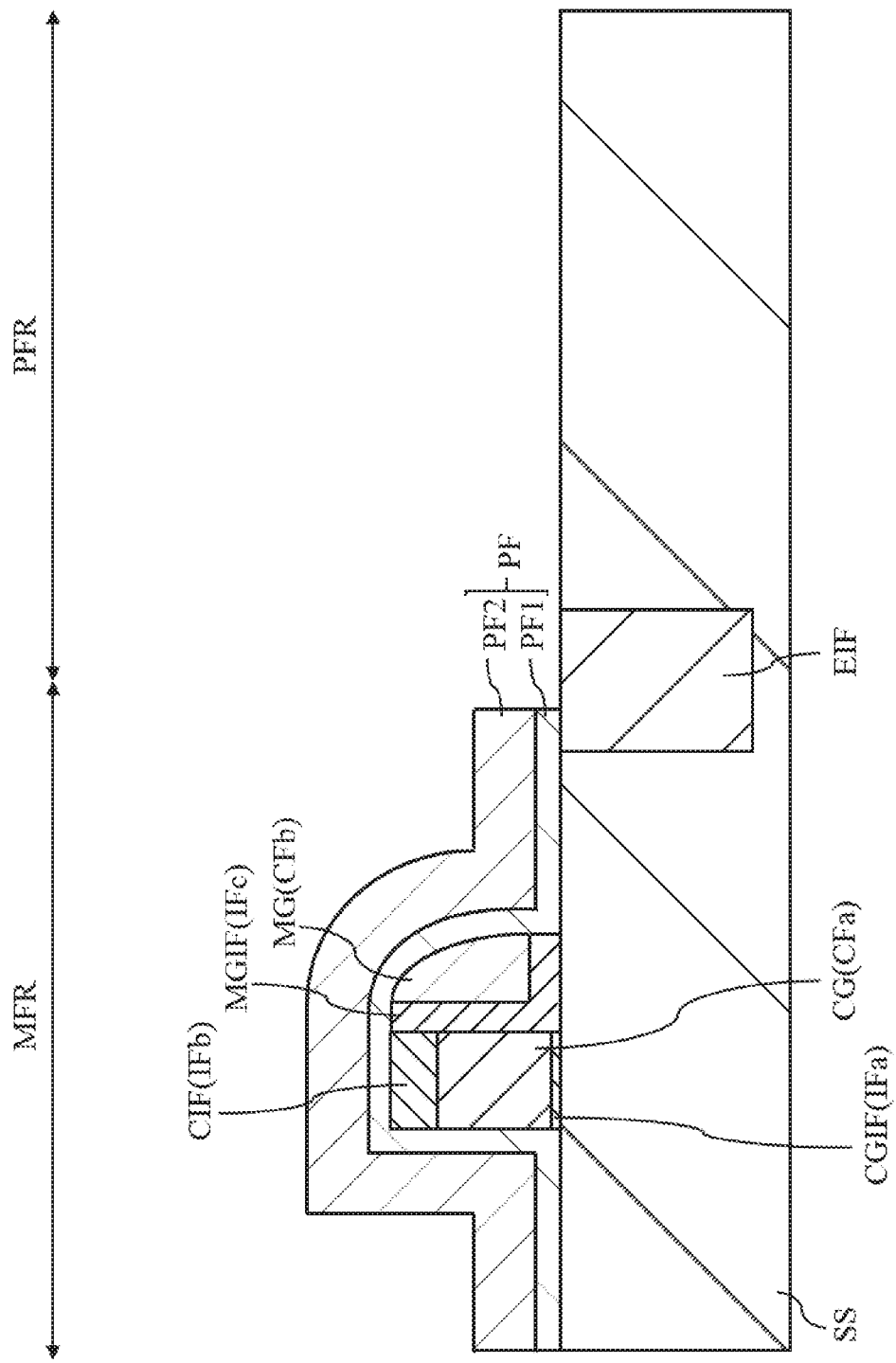
FIG. 16 is an enlarged cross-sectional view showing a step in a method of manufacturing a semiconductor device according to a compared example following the step shown in FIG. 4.
Figure 17:
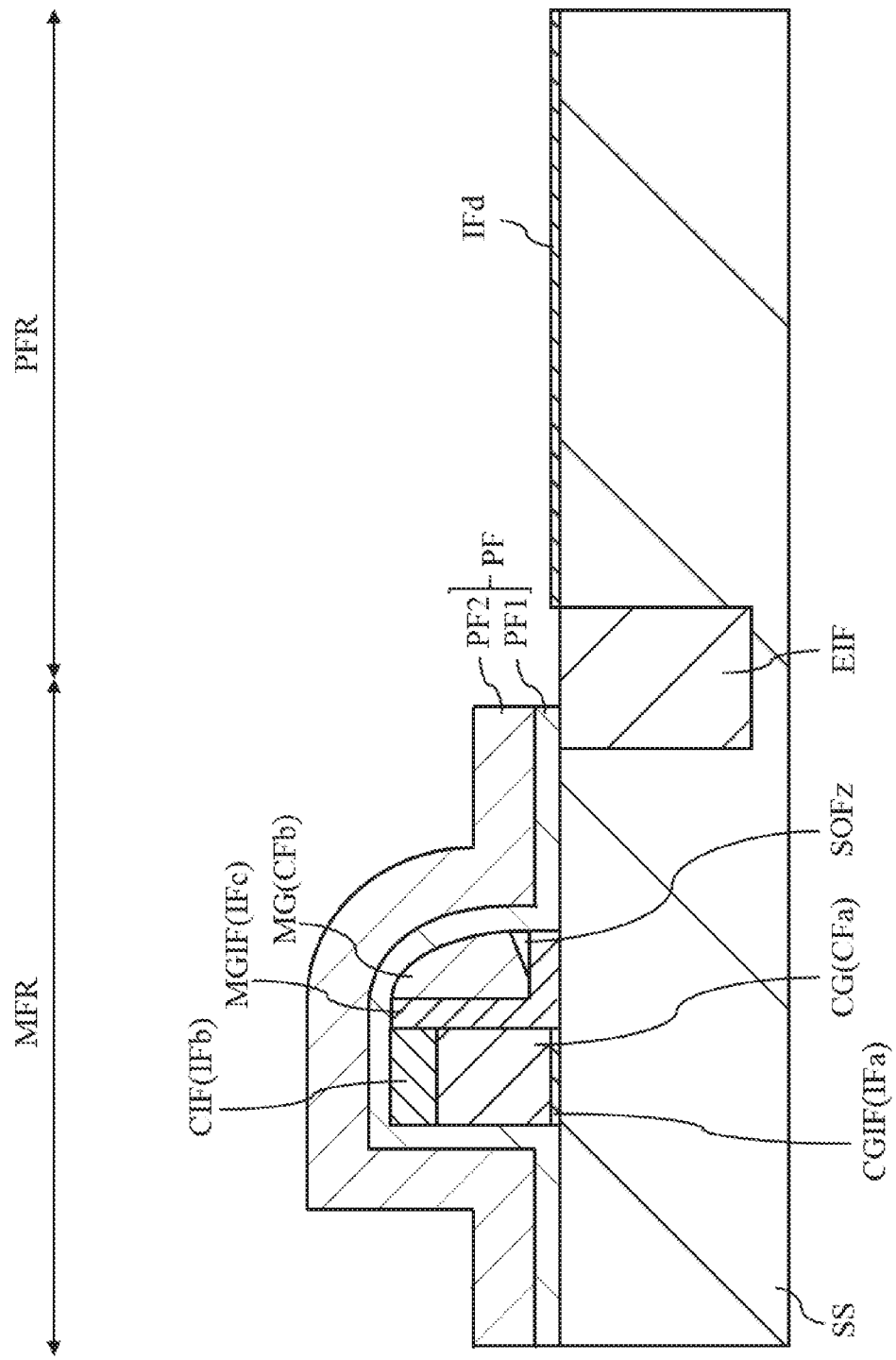
FIG. 17 is an enlarged cross-sectional view showing a step in the method of manufacturing the semiconductor device according to the compared example following the step shown in FIG. 16.

Next, the main features and effects of the method of manufacturing the semiconductor device will be described. First, for comparison, a method of manufacturing a semiconductor device according to a compared example will be described. FIG. 16 is an enlarged cross-sectional view showing the manufacturing step of the semiconductor device following FIG. 4 of the present embodiment. FIG. 17 is an enlarged cross-sectional view showing the manufacturing step of the semiconductor device following FIG. 16.

In the method of manufacturing the semiconductor device according to the compared example, the steps shown in FIGS. 1 to 4 are carried out in the same manner as in the method of manufacturing the semiconductor device of the present embodiment. Thereafter, as shown in FIG. 16, the memory gate electrode material CFb is anisotropically etched to form the memory gate electrodes MG on the semiconductor substrate SS located in the memory cell forming region MFR. Subsequently, the gate dielectric film material IFc is etched to form the gate dielectric films MGIF. Thereafter, the insulating films IFa and IFb and the conductive film CFa which are formed in the peripheral circuit forming region PFR, are removed in a state that the protective film PF which is a stacked film formed of the first protective film PF1 and the second protective film PF2, is formed so as to cover the control gate electrodes CG and the memory gate electrodes MG.

Next, as shown in FIG. 17, the insulating film IFd for the gate dielectric films GIF of the transistors PT are formed on the semiconductor substrate SS located in the peripheral circuit forming region PFR. The insulating film IFd is formed by performing heat treatment to the semiconductor substrate SS in an oxygen-atmosphere. That is, the insulating film IFd is formed by thermal oxidation method. The temperature of the heat treatment for forming the insulating film IFd is, for example, 700° C. or higher and 1100° C. or lower.

When the insulating film IFd for the gate dielectric films GIF of the transistors PT is formed by thermal oxidation method after the memory gate electrodes MG and the gate dielectric films MGIF are formed, oxygen contained in the protective film PF1 enters the interfaces between the memory gate electrodes MG and the gate dielectric films MGIF by the thermal treatment. The silicon oxide films SOFz are formed at the interfaces between the memory gate electrodes MG and the gate dielectric films MGIF by the entered oxygen reacting with the memory gate electrode material CFb that configures the memory gate electrodes MG. Thicknesses of the insulating films between the memory gate electrodes MG and the semiconductor substrate SS is larger than when the silicon oxide films SOFz are not formed. As a result, there is a possibility that the threshold voltages of the memory cells vary. In addition, the operation speeds of the memory cells may be degraded.

When the protective film PF formed in the memory cell forming region MFR is removed by etching after the gate electrodes PG and the gate dielectric films GIF are formed in the peripheral circuit forming region PFR, the end portions of the gate dielectric films MGIF located between the memory gate electrodes MG and the semiconductor substrate SS are exposed to the etching. This can cause defects at the end portions of the gate dielectric films MGIF. In this case, there is a possibility that the semiconductor regions DRm on the memory gate electrode MG side and the memory gate electrodes MG are short-circuited via the defects.

In the present embodiment, the memory gate electrodes MG are formed after the insulating film IFd for the gate dielectric films GIF of the transistors PT are formed by thermal oxidation. Therefore, heat treatment for forming the insulating film IFd is not performed on the memory gate electrodes MG. Therefore, the silicon oxide films SOFz are not formed at the interfaces between the memory gate electrodes MG and the gate dielectric films MGIF. In the present embodiment, when the protective film PF is removed, the memory gate electrodes MG and the gate dielectric films MGIF are not formed. Therefore, the end portions of the gate dielectric films MGIF are not exposed to the etching for removing the protective film PF. As a result, the reliability of the semiconductor device can be improved as compared with the semiconductor device of the compared example.

Configuration of Semiconductor Device

As shown in FIG. 15, the semiconductor device according to the present embodiment includes a semiconductor substrate SS, a memory cell MC, a transistor PT, interlayer insulating films ILa and ILb, plugs PLG, and wirings M1.

The semiconductor substrate SS is, for example, a p-type monocrystalline silicon substrate having a resistivity of about 1 Ωcm to 10 Ωcm. The semiconductor substrate SS has n-type well regions and p-type well regions. The n-type well regions contain n-type impurities such as phosphorus (P) and arsenic (As). The p-type well regions contain p-type impurities such as boron (B) and aluminum (Al).

The memory cell MC is formed on the semiconductor substrate SS located in the memory cell forming region MFR. The semiconductor device of the present embodiment has a plurality of memory cells MC. The memory cell MC includes a control gate electrode CG, a memory gate electrode MG, gate dielectric films CGIF and MGIF, a cap insulating film CIF, sidewall spacers SW, and semiconductor regions MSD.

The control gate electrode CG is formed on the semiconductor substrate SS via the gate dielectric film CGIF. The control gate electrode CG is formed so as to be adjacent to the memory gate electrode MG via the gate dielectric film MGIF. The control gate electrode CG extends in a gate width direction of the control gate electrode CG. A silicide layer may be formed on an upper surface of the control gate electrode CG. The material of the control gate electrode CG is, for example, polycrystalline silicon.

The memory gate electrode MG is formed on the semiconductor substrate SS via the gate dielectric film MGIF. The memory gate electrode MG is formed so as to be adjacent to the control gate electrode CG via the gate dielectric film MGIF. The memory gate electrode MG extends in a gate width direction of the memory gate electrode MG. A silicide layer may be formed on an upper surface of the memory gate electrode MG. The material of the memory gate electrode MG is, for example, polycrystalline silicon.

The gate dielectric film CGIF is formed on the semiconductor substrate SS. The gate dielectric film CGIF is formed between the semiconductor substrate SS and the control gate electrode CG. The material of the gate dielectric film CGIF is, for example, silicon oxide.

The gate dielectric film MGIF is formed on the semiconductor substrate SS. The gate dielectric film MGIF is formed between the memory gate electrode MG and the semiconductor substrate SS, and between the memory gate electrode MG and the control gate electrode CG. The gate dielectric film MGIF is a stacked film in which a first insulating film, a charge storage film and a second insulating film are stacked in this order. The charge storage film has a function of storing charges. The materials of the first insulating film, the charge storage film, and the second insulating film are as described above, respectively.

The cap insulating film CIF is formed on the control gate electrode CG. The cap insulating film CIF is a silicon oxide film, a silicon nitride film, or a stacked film thereof. The cap insulating film CIF is formed in order to secure the height of the memory gate electrode MG. When the height of the memory gate electrode MG is secured, the cap insulating film CIF need not be formed.

The sidewall spacers SW are formed on the semiconductor substrate SS. The sidewall spacers SW are formed on the side surface of the control gate electrode CG and on the side surface of the memory gate electrode MG. That is, the sidewall spacers SW are formed so as to sandwich a pattern formed of the control gate electrode CG, the memory gate electrode MG, and the gate dielectric film MGIF.

The semiconductor regions MSD are formed in the semiconductor substrate SS. The semiconductor regions MSD are formed so as to sandwich a channel region of the memory cell MC. The channel region of the memory cell MC is located in a region of the semiconductor substrate SS under the control gate electrode CG and the memory gate electrode MG. The semiconductor regions MSD function as a source region and/or drain region of the memory cell MC.

The transistor PT is formed on the semiconductor substrate SS located in the peripheral circuit forming region PFR. The semiconductor device of the present embodiment has a plurality of transistors PT. The transistor PT has a gate electrode PG, a gate dielectric film GIF, sidewall spacers SW, and semiconductor regions PSD.

The gate electrode PG is formed on the semiconductor substrate SS via the gate dielectric film GIF. The gate electrode PG extends in a gate width direction of the gate electrode PG. A silicide layer may be formed on an upper surface of the gate electrode PG. The material of the gate electrode PG is, for example, polycrystalline silicon.

The gate dielectric film GIF is formed on the semiconductor substrate SS. The gate dielectric film GIF is formed between the semiconductor substrate SS and the gate electrode PG. The material of the gate dielectric film GIF is, for example, silicon oxide.

The sidewall spacers SW are formed on the semiconductor substrate SS. The sidewall spacers SW are formed on side surfaces of the gate electrode PG. That is, the sidewall spacers SW are formed so as to sandwich the gate electrode PG.

The semiconductor regions PSD are formed in the semiconductor substrate SS. The semiconductor regions PSD are formed so as to sandwich a channel region of the transistor PT. The channel region of the transistor PT is located in a region of the semiconductor substrate SS under the gate electrode PG. The semiconductor regions PSD function as a source region and a drain region of the transistor PT.

The interlayer insulating film ILa is formed on the semiconductor substrate SS so as to cover the memory cell MC and the transistor PT. The plugs PLG are formed in the interlayer insulating film ILa so as to reach the main surface of the semiconductor substrate SS. Although not shown, the plugs PLG are also formed so as to reach each of the control gate electrode CG, the memory gate electrode MG, and the gate electrode PG. The plugs PLG are electrically connected to the control gate electrode CG, the memory gate electrode MG, the gate electrode PG, and the semiconductor regions MSD and PSD, respectively.

The interlayer insulating film ILb is formed on the interlayer insulating film ILa. The wirings M1 are formed in the interlayer insulating film ILb so as to reach the plugs PLG. The wirings M1 are electrically connected to the respective plugs PLG.

Operation of Memory Cell

Next, an operation of the memory cell MC will be described. Here, injection of electrons into the charge storage film of the memory cell MC is defined as "write", and injection of holes into the charge storage film of the memory cell MC is defined as "erase". Further, the two semiconductor regions MSD of the memory cell MC function as a drain region and a source region, respectively, depending on the operation of the memory cell MC. Here, the semiconductor region MSD on the control gate electrode CG side is defined as a drain region and the semiconductor region MSD on the memory gate electrode MG side is defined as a source region.

Hereinafter, each of the write operation, the erase operation, and the read operation will be described. FIG. 18 is a table showing an example of voltages applied to respective portions of a selected memory cell in the write operation, the erase operation, and the read operation. In the table of FIG. 18, the voltage Vd is a voltage applied to the drain region.

The voltage Vcg is a voltage applied to the control gate electrode CG. The voltage Vmg is a voltage applied to the memory gate electrode MG. The voltage Vs is a voltage applied to the source region. The voltage Vb is a voltage applied to the semiconductor substrate SS.

In the write operation, the voltage shown in the write row of FIG. 18 is applied to each portion of the selected memory cell. As a result, electrons flowing from the drain region toward the source region are injected into the charge storage film of the selected memory cell. The injected electrons are trapped in trap levels in the charge storage film. As a result, the threshold voltage of the memory transistor formed of the memory gate electrode MG, the gate dielectric film MGIF and the semiconductor region MSD rises. As a result, the memory cell MC is in a write state.

In the erase operation, the voltage shown in the erase row of FIG. 18 is applied to each portion of the selected memory cell. As a result, holes generated in the vicinity of the source region of the semiconductor substrate SS are injected into the charge storage film of the selected memory cell. The injected holes combine with electrons trapped in the trap levels of the charge storage film. As a result, the threshold voltage of the memory transistor is lowered. As a result, the memory cell MC is in an erase state.

In the read operation, the voltage shown in the read row of FIG. 18 is applied to each portion of the selected memory cell. The voltage Vmg is set to a value between the threshold voltage of the memory transistor in the write state and the threshold voltage of the memory transistor in the erase state. As a result, in the read operation, no current flows through the memory cell MC in the write state, and a current flows through the memory cell MC in the erase state. The state of the memory cell MC is read out depending on whether or not a current flows through the memory cell MC.

Although the invention made by the present inventor has been specifically described based on the embodiment, the present invention is not limited to the embodiment described above, and various modifications can be made without departing from the gist thereof.

What is claimed is:

1. A method of manufacturing a semiconductor device comprising:
   (a) preparing a semiconductor substrate having a memory cell forming region and a peripheral circuit forming region which is different from the memory cell forming region;
   (b) forming a control gate electrode on the semiconductor substrate located in the memory cell forming region via a first gate dielectric film;
   (c) forming a second gate dielectric film material and a memory gate electrode material on the semiconductor substrate located in the memory cell forming region and the peripheral circuit forming region so as to cover the control gate electrode;
   (d) after the step (c), selectively removing the memory gate electrode material and the second gate dielectric film material formed on the semiconductor substrate located in the peripheral circuit forming region by etching, and leaving a part of each of the memory gate electrode material and the second gate dielectric film material so as to cover the semiconductor substrate located in the memory cell forming region;
   (e) after the step (d), forming a third gate dielectric film on the semiconductor substrate located in the peripheral circuit forming region by performing heat treatment to the semiconductor substrate in a state that the semiconductor substrate located in the memory cell forming region is covered with the part of each of the memory gate electrode material and the second gate dielectric film material;
   (f) forming a gate electrode of a transistor for a peripheral circuit on the third gate dielectric film; and
   (g) after the step (f), forming a memory gate electrode and a second gate dielectric film by performing etching to the part of each of the memory gate electrode material and the second gate dielectric film material left on the semiconductor substrate located in the memory cell forming region.

2. The method according to claim 1,
wherein in the step (e), an insulating film including a part of the memory gate electrode material is formed between an end portion of the memory gate electrode material and an end portion of the second gate dielectric film material, and
wherein in the step (g), the insulating film is removed.

3. The method according to claim 1,
wherein the etching in the step (g) is anisotropic etching.

4. The method according to claim 1,
wherein temperature of the heat treatment in the step (e) is 700° C. or higher and 1100° C. or lower.

5. The method according to claim 1,
wherein the second gate dielectric film material and the second gate dielectric film are stacked films formed of a lower insulating film, a charge storage film formed on the lower insulating film, and an upper insulating film formed on the charge storage film.

6. The method according to claim 5,
wherein the lower insulating film is a silicon oxide film,
wherein the charge storage film is a silicon nitride film, a hafnium oxide film or hafnium silicate film, and
wherein the upper insulating film is a silicon oxide film or a film including aluminum, titanium, zirconium, yttrium, lanthanum, praseodymium or lutetium.

7. The method according to claim 1,
wherein the memory gate electrode material is a polycrystalline silicon film.

8. The method according to claim 1,
wherein the step (d) comprises:
   (d1) after the step (c), forming a protective film that covers the memory gate electrode material formed in the memory cell forming region and exposes the memory gate electrode material formed in the peripheral circuit forming region, on the memory gate electrode material; and
   (d2) after the step (d1), performing etching to the memory gate electrode material and the second gate dielectric film material using the protective film as a mask, thereby removing the memory gate electrode material and the second gate dielectric film material in the peripheral circuit forming region and leaving the memory gate electrode material and the second gate dielectric film material in the memory cell forming region.

9. The method according to claim 8,
wherein the protective film is a stacked film formed of a first protective film and a second protective film formed on the first protective film.

10. The method according to claim 9,
wherein the first protective film is a silicon oxide film, and
wherein the second protective film is a polycrystalline silicon film or a silicon nitride film.

11. The method according to claim 1,
wherein, in a gate length direction of the control gate electrode, a length of a bottom surface of the memory gate electrode material adjacent to the control gate electrode via the second gate dielectric film material in the step (d) is larger than a length of a bottom surface of the memory gate electrode.

\* \* \* \* \*